(12) United States Patent
Beatson et al.

(10) Patent No.: US 12,244,318 B2
(45) Date of Patent: Mar. 4, 2025

(54) TEMPERATURE SENSOR FOR A TCXO

(71) Applicant: eoSemi Limited, Cheshire (GB)

(72) Inventors: Peter Trevor Beatson, Didsbury Manchester (GB); George Hedley Storm Rokos, Greater London (GB)

(73) Assignee: eoSemi Limited, Cheshire (GB)

( * ) Notice: Subject to any disclaimer, the term of this patent is extended or adjusted under 35 U.S.C. 154(b) by 84 days.

(21) Appl. No.: 18/065,834

(22) Filed: Dec. 14, 2022

(65) Prior Publication Data

US 2023/0110657 A1 Apr. 13, 2023

Related U.S. Application Data

(63) Continuation of application No. PCT/GB2021/005168, filed on Jul. 2, 2021.

(30) Foreign Application Priority Data

Jul. 7, 2020 (GB) .................................. 2010398.2

(51) Int. Cl.
*H03L 1/02* (2006.01)
*G01K 7/01* (2006.01)
(Continued)

(52) U.S. Cl.
CPC ............... *H03L 1/022* (2013.01); *G01K 7/01* (2013.01); *H03B 5/04* (2013.01); *H03L 1/028* (2013.01); *H03M 1/12* (2013.01); *H03M 3/458* (2013.01)

(58) Field of Classification Search
CPC ............ H03L 1/022; H03L 1/028; G01K 7/01
See application file for complete search history.

(56) References Cited

U.S. PATENT DOCUMENTS 3,831,040 A * 8/1974 Nanba ....................... G05F 3/30
327/512
2009/0091373 A1 4/2009 Kiyohara et al.
(Continued)

FOREIGN PATENT DOCUMENTS

GB 2447992 10/2008
JP 2009-296236 12/2009
(Continued)

OTHER PUBLICATIONS

EEEGuide. Base Spreading Resistance. 2014. retrieved from https://www.eeeguide.com/base-spreading-resistance/ on Mar. 7, 2024 (Year: 2014).*

(Continued)

*Primary Examiner* — Ryan Johnson
(74) *Attorney, Agent, or Firm* — Levine Bagade Han LLP

(57) ABSTRACT

Disclosed herein is a temperature compensated crystal oscillator, TCXO, comprising: a crystal oscillator arrangement configured to generate an output signal of the temperature compensated crystal oscillator; and a temperature sensor arranged to generate a temperature sensor signal, wherein the output signal of the crystal oscillator arrangement is controlled in dependence on the temperature sensor signal; wherein: the temperature sensor comprises a plurality of transistor circuits; each transistor circuit comprises a transistor and a bias circuit; each transistor circuit is arranged to output a temperature signal that is dependent on the temperature of the transistor comprised by the transistor circuit; each bias circuit is configured such that the noise level in each output temperature signal is low; and the plurality of transistor circuits are arranged so that the temperature sensor signal is dependent on each of the plurality of output temperature signals.

11 Claims, 8 Drawing Sheets

(51) Int. Cl.
    *H03B 5/04*      (2006.01)
    *H03M 1/12*      (2006.01)
    *H03M 3/00*      (2006.01)

(56) References Cited

U.S. PATENT DOCUMENTS

2017/0179961 A1    6/2017   Itasaka et al.
2019/0316973 A1*  10/2019   Ippolito .................. G01K 7/01

FOREIGN PATENT DOCUMENTS

JP      2009-092449     11/2010
JP      2017-003457      1/2017

OTHER PUBLICATIONS

Kamran et al., "A CMOS Temperature Sensor With a Voltage-Calibrated Inaccuracy of ± 0.15° C. (3σ) From −55° C. to 125° C." IEEE Journal of Solid-State Circuits, 48(1), pp. 292-301 (2013).
Kourani et al., "Electronic frequency compensation of AlN-on-Si MEMS reference oscillators", Microelectronics Journal, pp. 72-84 (2016).
Zhu et al., "A 0.058mm224μW Temperature Sensor in 40nm CMOS Process with ±0.5° C. Inaccuracy from −55 to 175° C." Circuits Syst Signal Process 37(6), pp. 2278-2298 (2017).

* cited by examiner

TEMPERATURE SENSOR FOR A TCXO

CROSS-REFERENCE TO RELATED APPLICATIONS

This application is a continuation of International Patent Application Number PCT/GB2021/051683 filed Jul. 2, 2021, which claims the benefit of priority to GB 2010398.2 filed Jul. 7, 2020, the contents of which are incorporated herein by reference in their entireties.

FIELD OF TECHNOLOGY

The present invention relates to the provision of a temperature sensor for a temperature compensated crystal oscillator (TCXO). Embodiments provide a new transistor circuit for measuring the temperature of a crystal oscillator. The measured temperature may be used to compensate for temperature based performance variations of the crystal oscillator. Advantageously, the transistor circuit according to embodiments exhibits excellent noise performance, in particular at low frequencies.

BACKGROUND

In order to meet the demands of current and future communications standards there exists a requirement for a stable frequency reference with low phase noise. In many applications this is provided by a temperature compensated crystal oscillator, TCXO.

In such an arrangement the inherent temperature characteristic of the crystal oscillation frequency is compensated for variation in ambient temperature, typically by the inclusion of a parallel tuning capacitance. This requires some form of control loop comprising a temperature sensor, preferably in close thermal coupling with the crystal, to measure temperature and make the necessary adjustments to maintain frequency stability.

This requirement for low phase noise, in addition to frequency stability, has a direct bearing on the noise specification of the temperature sensor itself. Any noise arising within the sensor will be expressed in the phase noise properties of the frequency reference owing to the operation of the control loop outlined above.

In order to meet the low power, small form factor requirements for mobile communications and internet of things, IOT, applications, the temperature sensor and oscillator control circuitry are often implemented as a system on chip, SOC, integrated circuit.

Such SOC designs typically comprise: 1) a circuit which exhibits a defined temperature characteristic; 2) a temperature sensor for measuring said temperature characteristic; and 3) control circuitry for compensating the oscillation frequency based on said measurement.

There is a general need to improve on known SOC designs.

SUMMARY

According to a first aspect of the invention, there is provided a temperature compensated crystal oscillator, TCXO, comprising: a crystal oscillator arrangement configured to generate an output signal of the temperature compensated crystal oscillator; and a temperature sensor arranged to generate a temperature sensor signal, wherein the output signal of the crystal oscillator arrangement is controlled in dependence on the temperature sensor signal; wherein: the temperature sensor comprises a plurality of transistor circuits; each transistor circuit comprises a transistor and a bias circuit; each transistor circuit is arranged to output a temperature signal that is dependent on the temperature of the transistor comprised by the transistor circuit; each bias circuit is configured such that the noise level in each output temperature signal is low; and the plurality of transistor circuits are arranged so that the temperature sensor signal is dependent on each of the plurality of output temperature signals.

Preferably, for each transistor circuit, the transistor bias circuit is configured such that noise generated within the transistor is at least partially reduced by the bias circuit.

Preferably, for each transistor circuit: the transistor is an NPN transistor; and the transistor bias circuit is configured so that the output temperature signal is dependent on the collector-emitter voltage of the transistor.

Preferably, for each transistor circuit, the transistor bias circuit comprises: a bias resistor arranged between a power supply of the transistor bias circuit and the base terminal of the transistor; a collector-base resistor arranged between a collector terminal and the base terminal of the transistor; and the emitter terminal of the transistor is connected to ground.

Preferably, for each transistor circuit, the value of the collector-base resistor is substantially equal to the inverse of the transconductance of the transistor.

Preferably, for each transistor circuit, the bias resistor and collector-base resistor are the same type of resistor.

Preferably, for each transistor circuit, the transistor bias circuit comprises: a buffer arranged between a collector terminal and a base terminal of the transistor; a bias resistor arranged between a power supply of the transistor bias circuit and the collector terminal of the transistor; and the emitter terminal of the transistor is connected to ground.

Preferably, the buffer has a gain of 1.

Preferably, for each transistor circuit, the buffer is an emitter follower.

Preferably, for each transistor circuit, the buffer comprises a MOS based amplifier arranged in a low noise configuration.

Preferably, for each transistor circuit, the base spreading resistance of the transistor is in the range 1 Ohm to 200 Ohm, preferably 2 Ohm to 20 Ohm, and more preferably 10.5 Ohm.

Preferably, the temperature sensor is thermally coupled to the crystal oscillator circuit arrangement.

Preferably: the crystal oscillator circuit arrangement comprises a crystal oscillator; and the temperature sensor is thermally coupled to the crystal oscillator.

Preferably, the temperature sensor comprises: an analogue-to-digital convertor, ADC; wherein the ADC is arranged to generate the temperature sensor signal in dependence on each of the output temperature signals from the plurality of transistor circuits.

Preferably, the ADC is a delta-sigma modulator, DSM.

Preferably, wherein the number of transistor circuits is two.

Preferably, the DSM is configured so that the output signal, $D_{OUT}$, of the DSM is:

$$D_{OUT} = \frac{(k_{n1}V_{CE1} + k_{n2}V_{CE2})}{(k_{d1}V_{CE1} + k_{d2}V_{CE2})}$$

Where: $V_{CE1}$ is the collector-emitter voltage of the transistor in a first one of the transistor circuits; $V_{CE2}$ is the collector-emitter voltage of the transistor in a second one of the transistor circuits; the coefficients $k_{n1}$, $k_{n2}$, $k_{d1}$, $k_{d2}$ are dependent on the sampling capacitances of the DSM; and the sampling capacitances of the DSM are selected so that $k_{n1}$, $k_{n2}$, $k_{d1}$, $k_{d2}$ can take positive, negative or zero values.

Preferably, the sampling capacitances of the DSM are selected so that: $k_{n1}$=2.75; $k_{n2}$=−3.5; $k_{d1}$=0; and $k_{d2}$=0.75.

Preferably, the temperature sensor comprises a first transistor circuit and a second transistor circuit; and the ratio of the current density of the transistor in the first transistor circuit and the second transistor circuit is greater than 50:1, and is preferably 100:1.

According to a second aspect of the invention, there is provided an integrated circuit comprising a TCXO according to the first aspect.

DETAILED DESCRIPTION

Embodiments provide a new transistor circuit that is a temperature sensor. The temperature sensor has improved performance over known temperature sensors. In particular, the temperature sensor according to embodiments exhibits excellent noise performance, in particular at low frequencies, as is required for communications technologies.

A known temperature sensor is disclosed in: "A CMOS Smart Temperature Sensor With a 3σ Inaccuracy of 0.1° C. from −55° C. to 125° C."; Michiel A. P. Pertijs et. al.; IEEE JOURNAL OF SOLID-STATE CIRCUITS VOL 40 NO. 12 Dec. 2005. This paper is referred to herein as [1].

The known circuit in [1] is solely a temperature sensor and the primary design criterion is absolute accuracy. The digital output from the sensor in [1] is not used in a control loop to maintain a temperature independent frequency reference, as is the case with a TCXO. A problem with the temperature sensor disclosed in [1] is that it has poor noise performance, in particular at low frequency.

Figure 1:
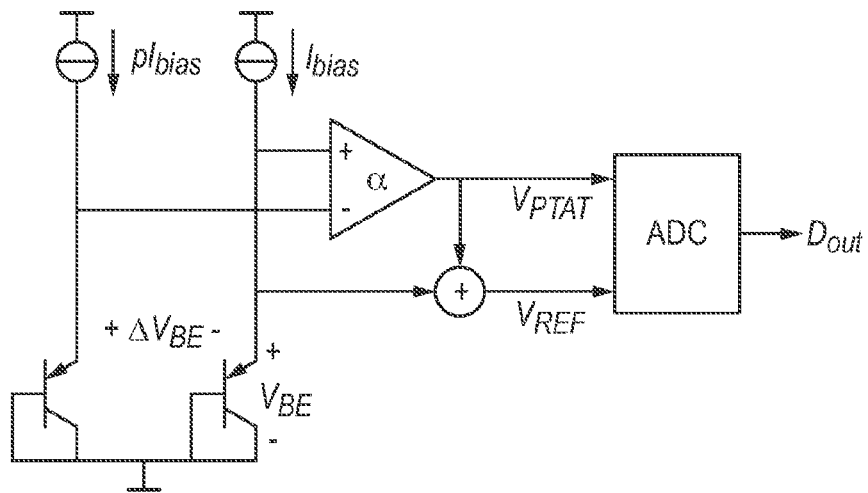
FIG. 1 shows a known temperature measurement circuit.

FIG. 1 shows a circuit disclosed in [1]. As shown in FIG. 1, the temperature dependent circuitry comprises two substrate PNP bipolar junction transistors, BJTs. However, the direct connection between the base and collector terminals of the BJTs result in the BJTs effectively being diodes. The base emitter voltage, $V_{BE}$, of these devices are combined in such a manner as to generate a voltage directly proportional to the absolute temperature $V_{PTAT}$ as the input to an analogue to digital converter, ADC, and also a temperature independent voltage, $V_{REF}$, which serves as a stable reference for the ADC against which the temperature dependent input is compared.

The circuit shown in FIG. 1 is an established technique for generating temperature independent and dependent references on integrated circuits. The circuit in FIG. 1 is, however, unsuited for temperature measurement in a TCXO application, in particular one which is required to exhibit low phase noise at frequencies approaching the crystal oscillation frequency, referred to as close-in phase noise.

Embodiments improve on the circuit disclosed in [1]. Low frequency noise is typically a result of flicker noise in the BJT devices and their associated bias circuitry. Embodiments achieve low close-in phase noise by reducing, and preferably eliminating, low frequency noise arising in the temperature dependent circuitry.

Additionally, embodiments perform temperature measurements in a manner that minimizes low frequency noise in the digital output of the ADC because this is expressed directly as close in phase noise in the TCXO frequency reference.

No such measures are taken to reduce low frequency noise in the temperature dependent circuitry disclosed in [1]. Furthermore, in [1] the measurement approach of using a fixed, temperature independent, reference $V_{REF}$ is intended to achieve absolute accuracy at the expense of low frequency noise in the digital output $D_{OUT}$.

Figure 2:
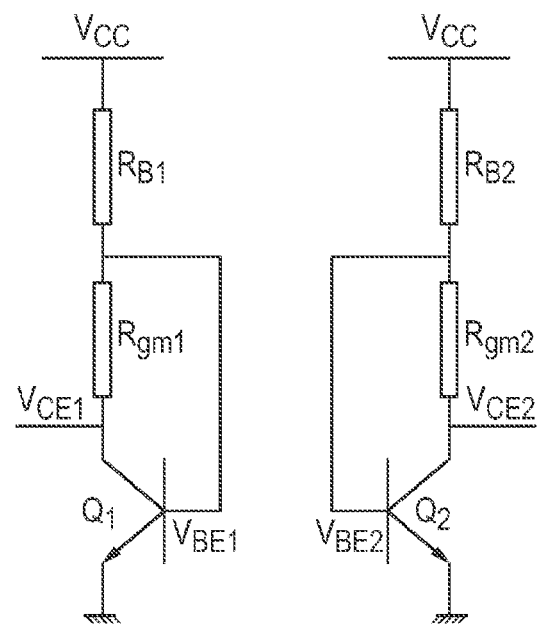
FIG. 2 shows a transistor based temperature measurement circuit according to a first embodiment.

FIG. 2 shows two transistor circuits for measuring temperatures according to a first embodiment. The two transistor circuits in FIG. 2 may be respectively used instead of the two known transistor circuits for providing the $V_{PTAT}$ and $V_{REF}$ signals in FIG. 1. However, embodiments also include the two transistor circuits in FIG. 2 being used as described later for the third embodiment.

The lefthand circuit in FIG. 2 comprises power supply VCC, bias resistor $R_{B1}$, collector-base resistor $R_{gm1}$ and NPN transistor Q1. The output of the transistor circuit is $V_{CE1}$. The base-emitter voltage is $V_{BE1}$.

The righthand circuit in FIG. 2 comprises power supply VCC, bias resistor $R_{B2}$, collector-base resistor $R_{gm2}$ and NPN transistor Q2. The output of the transistor circuit is $V_{CE2}$. The base-emitter voltage is $V_{BE2}$.

The transistor circuits in FIG. 2 achieve good close-in phase noise because the bias circuitry of the transistors substantially reduces low frequency noise within the temperature sensing circuitry.

The transistor circuits disclosed in [1] use substrate PNP devices, operated as diodes, that have a poor forward current gain (β). The MOS current source bias used in [1] inherently results in high levels of flicker (1/f) noise. The increase of this noise type in inverse proportion to the frequency can severely compromise close in phase-noise in TCXO applications.

The transistor circuits according to embodiments alternatively bias transistors in a low noise configuration. In the embodiment shown in FIG. 2, NPN devices are used and these may provide improved performance over PNP devices. Advantageously, the bias is provided by passive components and these exhibit the lowest level of flicker noise.

The transistor circuits according to the embodiment use the collector emitter voltage $V_{CE}$ of the BJTs as the sensor circuitry output, rather than the base emitter voltage $V_{BE}$ as disclosed in [1]. When combined with appropriately scaled resistors $R_{gm1}/R_{gm2}$, this can result in cancellation of noise both from the power supply VCC, and flicker noise arising in the base emitter junction of the BJT devices.

An explanation of these advantages of the transistor circuit according to the first embodiment is provided below.

Figure 3:
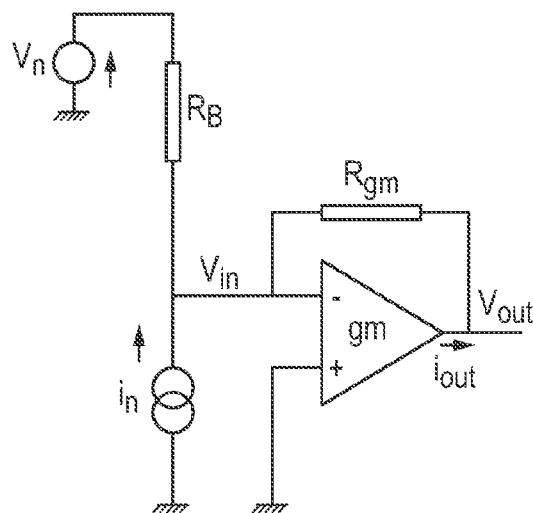
FIG. 3 is a representation of a small signal equivalent circuit of a transistor circuit according to a first embodiment.

FIG. 3 is a representation of a small signal equivalent circuit of one of the transistor circuits in FIG. 2. FIG. 3 may represent the small signal equivalent circuit of the lefthand transistor circuit in FIG. 2, in which case components $R_B$ and $R_{gm}$ respectively correspond to components $R_{B1}$ and $R_{gm1}$. FIG. 3 may also represent the small signal equivalent circuit of the righthand transistor circuit in FIG. 2, in which case components $R_B$ and $R_{gm}$ respectively correspond to components $R_{B2}$ and $R_{gm2}$.

The following explanation is made with FIG. 3 representing the small signal equivalent circuit of the lefthand transistor circuit in FIG. 2.

In FIG. 3, the transistor Q1 has been replaced with a transconductor, with a transconductance $g_m$, with the base terminal represented as the inverting input of the transconductor and the collector terminal as the output. The resistor $R_{gm}$ now appears across the transconductor from the output to the inverting (−) input.

The operation of the equivalent circuit will be explained when subjected to a noise current $i_n$, that is representative of a low frequency flicker noise current arising in the base emitter junction of Q1, and when the power supply voltage VCC is subjected to a noise voltage $v_n$, that is representative of a low frequency flicker noise in the regulated supply to the sensor circuitry.

For the flicker noise current term $i_n$:

$$v_{out} = i_n \frac{(1 - g_m R_{gm})}{\frac{1}{R_B} + g_m} \quad \text{(eqn. 1)}$$

For the supply voltage noise term $v_n$:

$$v_{out} = v_n \frac{\left(1 - \frac{1}{g_m R_{gm}}\right)}{\frac{R_B}{R_{gm}} + \frac{1}{g_m R_{gm}}} \quad \text{(eqn. 2)}$$

From which it is clear that the noise contribution from both $i_n$ and $v_n$ is cancelled when $$R_{gm} = 1/g_m \quad \text{(eqn. 3)}$$

Consider now the relationship between the bias current I and the transconductance for a BJT device obtained by differentiating the expression for collector current, $I_c$ with respect to base emitter voltage $V_{be}$.

$$I_c = I_s e^{qV_{be}/kT} \quad \text{(eqn. 4)}$$

$I_s$ is the reverse saturation current $q$ is the electronic charge $k$ is Boltzmann's constant $T$ is the absolute temoerature $V_{be}$ is the base emitter voltage $$\frac{\partial I_c}{\partial V_{be}} = \frac{q}{kT} I_s e^{qV_{be}/kT} = I_c \frac{q}{kT} \quad \text{(eqn. 5)}$$

Eqn. (5) illustrates that for a BJT device the transconductance $g_m$ is directly proportional to the collector bias current $I_c$. This direct proportionality ensures that, provided the passive bias resistor $R_B$ and feedback resistor $R_{gm}$ are implemented using the same resistor type, then the condition for noise cancellation identified in eqn. (3) can be maintained over variation in the absolute value of the bias resistor $R_B$ and feedback resistor $R_{gm}$ with manufacturing process tolerance.

Consider also the inverse proportionality of transconductance with absolute temperature identified in eqn. (5).

By ensuring that the collector current $I_c$ is of the form $$I_c = mT \quad \text{(eqn. 6)}$$

Where m is a constant of proportionality

The term 1/T in eqn. (5) can be cancelled out, ensuring the relationship between $R_{gm}$ and $g_m$ identified in eqn. (3) can be maintained over variation in temperature.

Assuming the additional voltage drop across $R_{gm}$, due the small base current term $I_c/\beta$, is negligible then $$I_c = \frac{(V_{cc} - V_{be})}{R_B} \quad \text{(eqn. 7)}$$

For $I_c$ to be directly proportional to absolute temperature, with no additional constant term, then $$V_{cc} = V_{be}|T=0° \text{ K} \quad \text{(eqn. 8)}$$

This is the bandgap voltage $V_{BG}$, which for a silicon BJT is approximately 1.28V.

Figure 4:
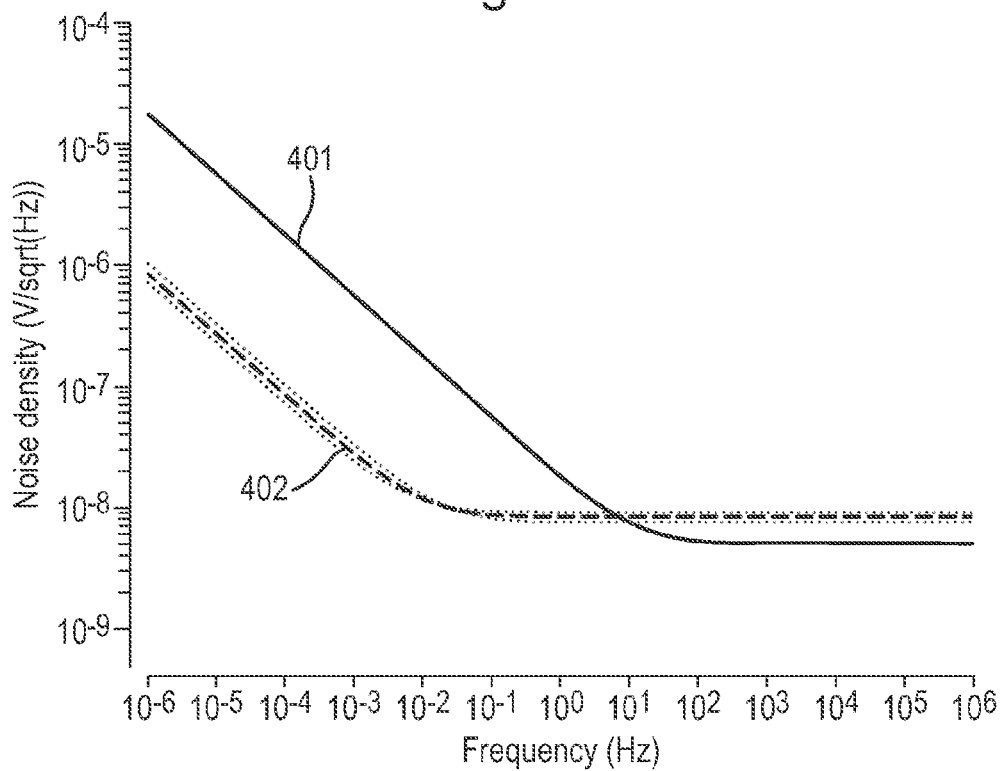
FIG. 4 is a graph that illustrates noise reduction effect of the first embodiment.

FIG. 4 is a graph that illustrates the impact of the noise cancellation approach according to the above-described first embodiment compared with the conventional $V_{be}$ based sensor as used in [1]. FIG. 4 shows the variation of noise density with frequency. The solid line in FIG. 4, labelled 401, corresponds to the techniques disclosed in [1]. The dashed line in FIG. 4, labelled 402, corresponds to the techniques of the first embodiment.

In FIG. 4, the results indicating the noise density vs. frequency performance of the first embodiment have been generated with the following:

NPN BJT are used
$I_c$=10 μA
Beta=155
$g_m$=360 μA/V
Rbb=105 Ohm
KF=16.2E-12
AF=1.6

In the above, KF is the flicker noise coefficient and AF is the flicker noise exponent.

KF and AF are parameters which define the flicker noise performance for a given device. Unlike many of the other parameters associated with BJT devices, KF and AF are highly process dependent, often reflecting the quality of the manufacture, in particular defects in the physical structure of the BJT.

The flicker noise current used in the small signal analysis shown in FIG. 3 is related to the operating conditions of the device, and the values of KF and AF, by the equation:

$$\overline{i_n^2} = KF \frac{(I_B)^{AF}}{f} \Delta f$$

Where:
$i_n$ is the flicker noise current;
KF is the flicker noise coefficient;
$I_B$ is the base current;
AF is the flicker noise exponent;
f is the frequency; and
$\Delta f$ is the frequency bandwidth of the noise measurement.

With reference to FIG. 2, the values of $R_{B1}$, $R_{B2}$, $R_{gm1}$ and $R_{gm2}$ used to generate the results shown in FIG. 4 are:
$R_{B1}$=67 k Ohms
$R_{B2}$=67 k Ohms
$R_{gm1}$=2.8K Ohms
$R_{gm2}$=2.8K Ohms It should be noted that at a collector current $I_c$ of 10 µA, the transconductance, $g_m$, of the NPN BJT used to generate FIG. 4 is 360 µA/V.

For substantial noise cancellation, $R_{gm}=1/g_m$ (see eqn. 3) and:

$$2.8 k\Omega = \frac{1}{360 \, \mu A/V}$$

The condition for substantial noise cancellation is therefore achieved.

For $R_{gm}=1/g_m$ the low frequency noise density is suppressed by approximately 26 dB over the default case, where $R_{gm}=0$.

FIG. 4 also indicates, with the dotted lines above and below the dashed line 402, the impact of varying the absolute value of $R_{gm}$ and $R_B$ by +/−20% to reflect manufacturing process tolerance. This shows that the suppression of the low frequency noise is relatively insensitive to absolute resistor value owing to the relationship between $I_c$ and $g_m$ identified in eqn. (5).

FIG. 4 shows some slight elevation in the noise density at high frequency when adopting the noise cancellation technique. This is a result of thermal noise in the resistor $R_{gm}$. The elevated noise can easily be removed by low pass filtering the ADC output. Furthermore, as the objective is to achieve a TCXO with good close in phase noise, the low frequency noise density suppression is the primary objective.

Figure 5:
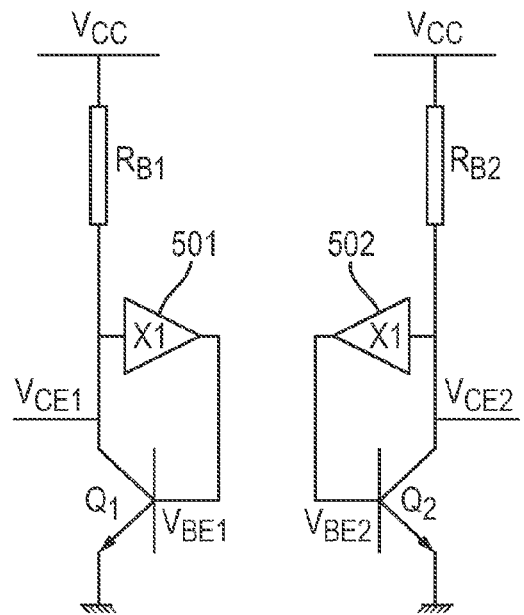
FIG. 5 shows a transistor based temperature measurement circuit according to a second embodiment.

FIG. 5 shows two transistor circuits for measuring temperatures according to a second embodiment. The lefthand and righthand transistor circuits in FIG. 5 may be respectively used instead of the lefthand and righthand transistor circuits shown in FIG. 3 for the first embodiment.

Each transistor circuit of the second embodiment differs from that of the first embodiment by replacing the collector-base resistor, $R_{gm}$, with a buffer 501, 502. The buffer 501, 502 may be a unity gain buffer, i.e., have a gain of one. The buffer 501, 502 may, for example, be implemented as a simple BJT emitter follower or a more complex MOS based amplifier using a chopping technique to eliminate the effect of flicker noise within the MOS devices in the buffer itself.

Figure 6:
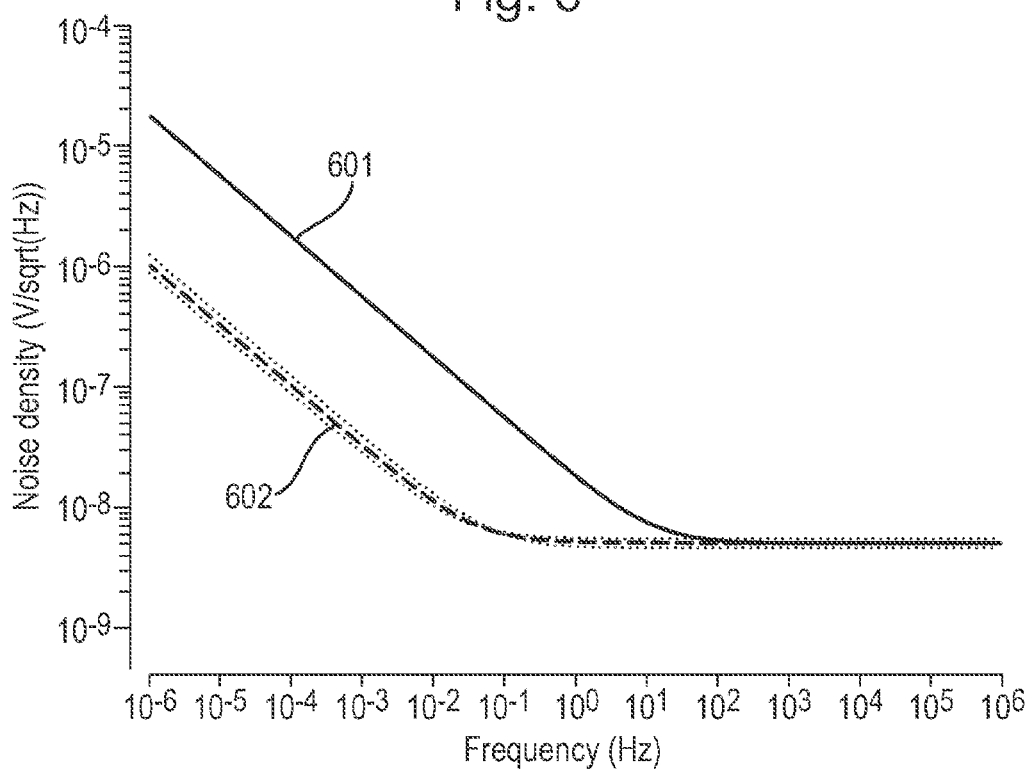
FIG. 6 is a graph that illustrates noise reduction effect of the second embodiment.

FIG. 6 is a graph that shows how the transistor circuits of the second embodiment suppress the low frequency noise density.

In FIG. 6, the results indicating the noise density vs. frequency performance of the second embodiment have been generated with the following:
NPN BJT are used
$I_c$=10 µA
Beta=155
$g_m$=360 µA/V
Rbb=105 Ohm
KF=16.2E-12
AF=1.6

As described above with reference to FIG. 4, KF is the flicker noise coefficient and AF is the flicker noise exponent.

The results shown in FIG. 6 have been generated with the following values of $R_{B1}$ and $R_{B2}$ used in the circuit shown in FIG. 5:
$R_{B1}$=67 k Ohms
$R_{B2}$=67 k Ohms The solid line in FIG. 6, labelled 601, corresponds to the techniques disclosed in [1]. The dashed line in FIG. 6, labelled 602, corresponds to the techniques of the second embodiment. FIG. 6 also indicates, with the dotted lines above and below the dashed line 602, the impact of varying the absolute value of $R_{gm}$ and $R_B$ by +/−20% to reflect manufacturing process tolerance.

The transistor circuits of the second embodiment benefit from the same noise insensitivity due absolute tolerance of bias resistor $R_B$. Additionally there is no elevation in the noise density at high frequency as the thermal noise due to $R_{gm}$ is no longer present.

The ability to cancel low frequency noise due to flicker noise current in the base emitter junction is limited by the base spreading resistance, $R_{bb'}$, of the BJT devices. This resistance is internal to the device and the resulting voltage noise arising from the flicker noise current flowing in $R_{bb'}$ cannot be addressed by circuitry external to the BJT itself.

Figure 7:
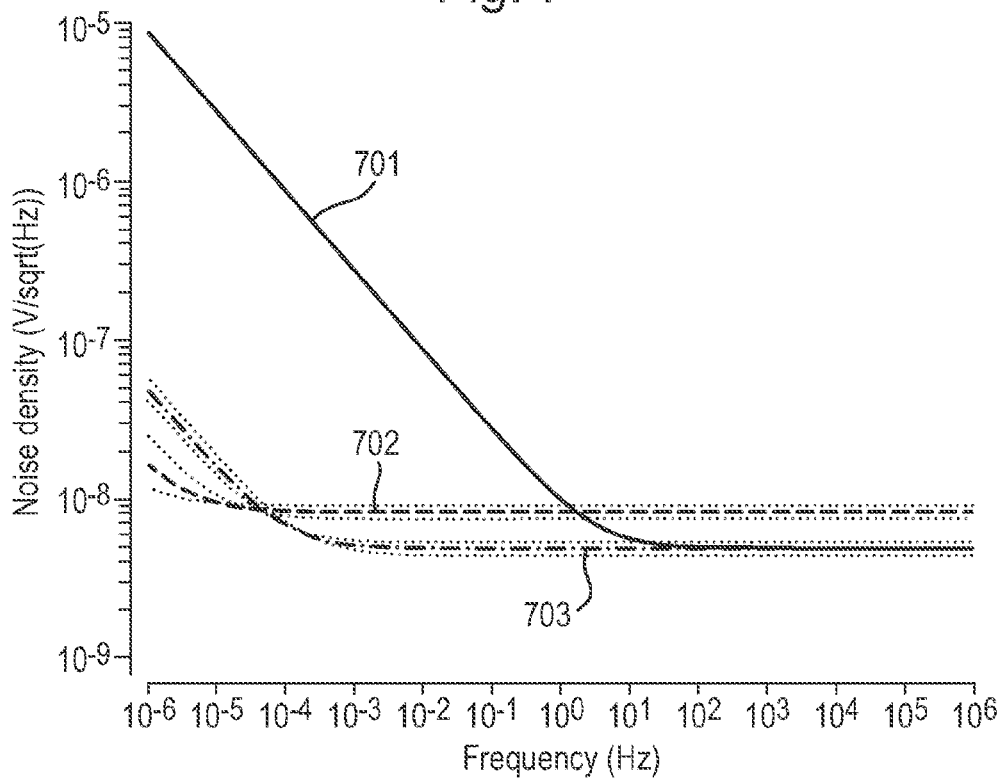
FIG. 7 is a graph that illustrates noise reduction effect of the first and second embodiments.

The value of $R_{bb'}$ is a function of the BJT area. FIG. 7 illustrates the low frequency noise density suppression for both the transistor circuits of the first and second embodiments for the case where the BJT area is increased by a factor of 10.

In FIG. 7, the results indicating the noise density vs. frequency performance of the first and second embodiments have been generated with the following
NPN BJT are used
$I_c$=10 µA
Beta=175
$g_m$=360 µA/V
$R_{bb'}$=10.5 Ohm
KF=16.2E-12
AF=1.6

The results shown in FIG. 7 have been otherwise generated under substantially the same conditions as described earlier with reference to FIGS. 2 and 5.

Accordingly:
$R_{B1}$=67 k Ohms
$R_{B2}$=67 k Ohms

The solid line in FIG. 7, labelled 701, corresponds to the techniques disclosed in [1]. The line in FIG. 7 labelled 702 corresponds to the techniques of the first embodiment. The line in FIG. 7 labelled 703 corresponds to the techniques of the second embodiment.

In this case the value of $R_{bb'}$ has been reduced by a factor of 10 from 105 Ohm to 10.5 Ohm. The effectiveness of the transistor circuits of the first and second embodiments in reducing low frequency noise density is clear, with both achieving well in excess of 40 dB of low frequency noise suppression with little sensitivity to the absolute tolerance of bias resistor $R_B$.

Accordingly, the transistor circuits for temperature sensor circuitry of the first and second embodiments suppress the effect of the flicker noise current in the base emitter junction of the BJT devices. The impact of the flicker noise flowing in the $1/g_m$ dynamic impedance of the BJT is mitigated.

In each of the transistor circuits of the first embodiment, this is achieved through cancellation of the effect by an appropriately scaled resistor between base and collector.

In each of the transistor circuits of the second embodiment, a low impedance unity gain buffer between collector and base prevents the flicker noise current flowing in the $1/g_m$ dynamic impedance entirely.

According to a third embodiment, the noise in the output signal of the ADC of a temperature sensor for a TCXO is reduced.

In FIG. 2, the two transistors respectively generate a temperature measurement signal, $V_{PTAT}$, and a reference signal $V_{REF}$. A temperature measurement signal, $D_{OUT}$, is generated in dependence on $V_{PTAT}$ and $V_{REF}$. The third embodiment differs from the known implementation shown in FIG. 2 by both transistors generating temperature dependent signals. A temperature measurement signal, $D_{OUT}$, is then generated in dependence on the temperature dependent signal generated by each transistor.

The techniques of the first and second embodiments implement a temperature sensing circuit architecture which suppresses low frequency noise. However, in order to achieve good close-in phase noise in a TCXO application, it is also preferable for the design and implementation of the ADC used to measure the output of the temperature sensor to have good low frequency noise performance.

The known implementations of analogue-to-digital convertors, ADCs, may compromise low frequency noise performance in a number of ways including:

1) Noise in the reference for the ADC (i.e., VREF in FIG. 1).
2) Reduced temperature sensitivity of the sensor/ADC architecture.
3) Amplification of sensor noise to achieve desired sensitivity.

The ADC disclosed in [1] uses an approach known as a single bit delta sigma modulation, DSM. In ADCs of this type the converted digital output is expressed by the mean value of the binary bit stream at the ADC output. This mean value is extracted by subsequent digital signal processing. Ultimately the ADC output is then expressed as a dimensionless ratio between the input and the ADC reference.

$$D_{OUT} = \overline{\text{bit stream}} = \frac{V_{IN}}{V_{REF}}$$

From eqn. 9 it is clear that noise in the ADC reference is of equal concern as noise in the input from the temperature sensor circuitry.

In [1] the VIN term is generated from an amplified version of the difference between the VBE of the QL and QR substrate PNP transistors in the temperature sensing circuitry. For BJT devices operating at differing current densities this difference, ΔVBE, can be shown to be directly proportional to absolute temperature (PTAT) with the relationship.

$$\Delta V_{BE} = \frac{kT}{q} \log_e \frac{J_L}{J_R} \qquad \text{(eqn. 10)}$$

Where $J_L$ and $J_R$ are the current densities of $Q_L$, and $Q_R$ respectively.

In order to preserve the accuracy of the PTAT term in eqn. 10 the operating conditions of the low performance substrate BJT devices must be kept reasonably similar. This restricts the ratio of current densities JL and JR in [1] to a value of 5:1.

For a nominal temperature of 300° K this gives:

$V_{IN}$=41.6 mV and a relatively modest temperature sensitivity:

$$\frac{\partial V_{IN}}{\partial T} = 139 u V/°K \qquad \text{(eqn. 11a, 11b)}$$

Figure 8:
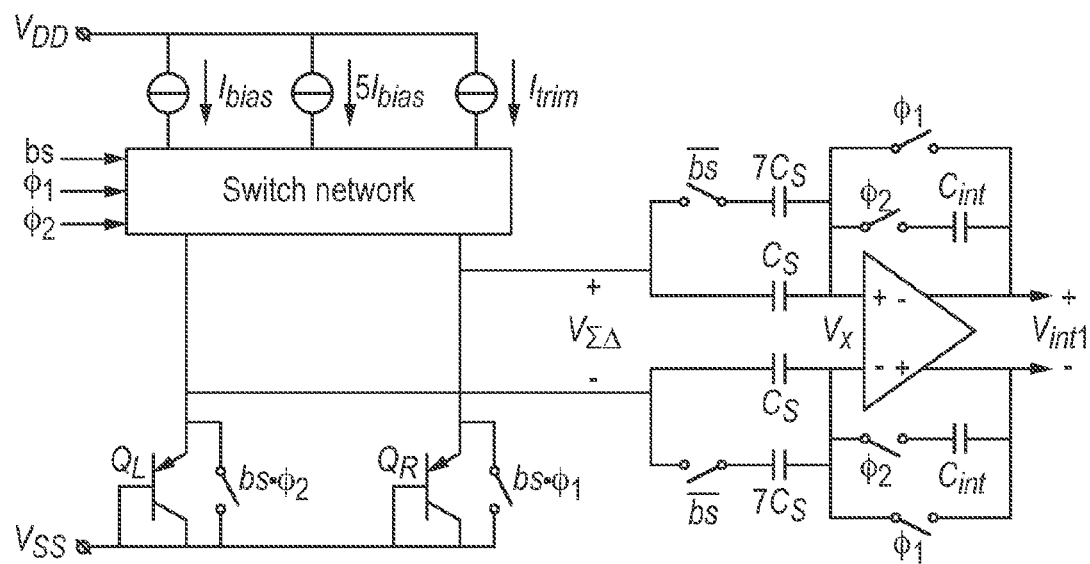
FIG. 8 shows a known implementation of a DSM ADC.

FIG. 8 shows the implementation of the DSM ADC in [1].

In [1], to achieve the required sensitivity to temperature the input term is multiplied by a factor α=16, implemented by the choice of sampling capacitors in the first stage of the DSM, as shown in FIG. 8. This inherently amplifies the noise from the sensor by the same gain term α=16.

In [1], the ADC reference, i.e., $V_{REF}$ in eqn. 9, is arranged to be temperature independent. This is achieved by adding the amplified PTAT term, $\alpha\Delta V_{BE}$, and the mean $V_{BE}$ of $Q_L$, and $Q_R$, to produce the temperature independent bandgap voltage $V_{BG}$. The resulting ADC output, $D_{OUT}$, is given by $$D_{OUT} = \frac{V_{IN}}{V_{REF}} = \frac{\alpha \Delta V_{BE}}{\alpha \Delta V_{BE} + \overline{V_{BE}}} \qquad \text{(eqn. 12)}$$

It should be noted that the denominator in eqn.12 contains the amplified term from the sensor, $\alpha\Delta V_{BE}$, and hence will increase the overall noise of the ADC digital output, $D_{OUT}$.

Figure 9:
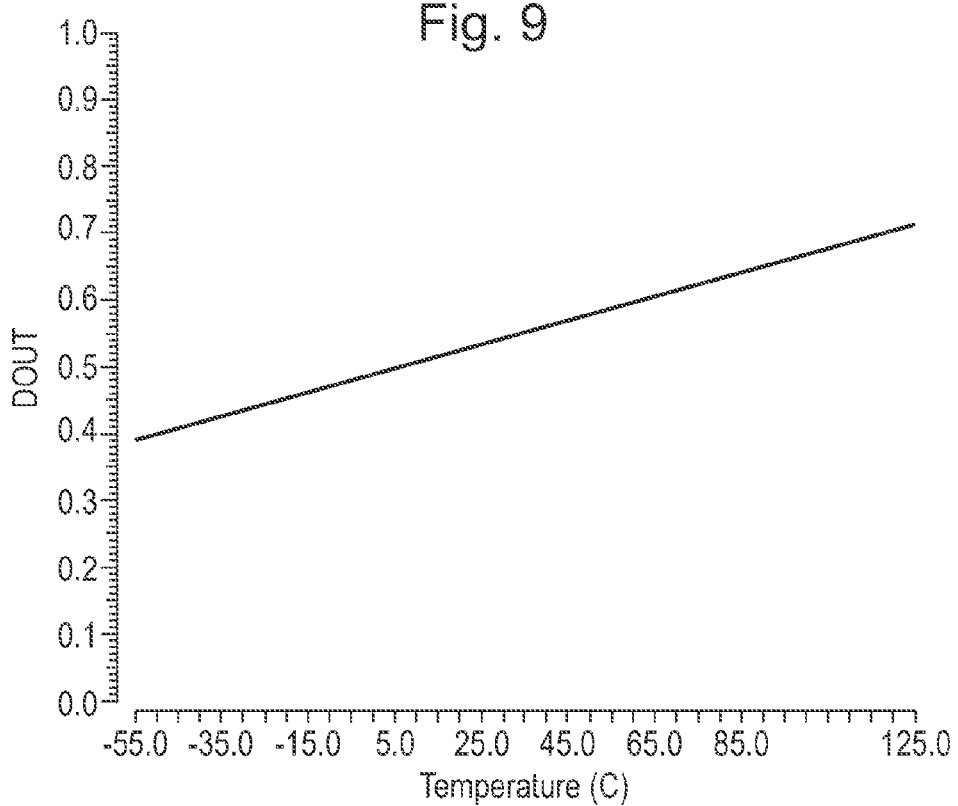
FIG. 9 shows the output signal vs. temperature characteristic of a known temperature measurement circuit.

FIG. 9 shows the $D_{OUT}$ versus temperature characteristic given by eqn. 12 for the values of α and $\Delta V_{BE}$ in [1]. In FIG. 9, the gradient of $D_{OUT}$ is 1.8E-3 V/° K.

The graph shown in FIG. 9 has been generated with the following:

α=16
$\Delta V_{BE}$=41.6 mV|300° K
$\partial\Delta V_{BE}/\partial T$=139 uV/° K|300° K
$\alpha\Delta V_{BE}+V_{BE}$=1.2V ($V_{BG}$ Silicon)
$\partial\Delta V_{BG}/\partial T$=0

For the above values:

$$\frac{\partial D_{OUT}}{\partial T} = \frac{\alpha \partial \Delta V_{BE}/\partial T}{\alpha \Delta V_{BE} + \overline{V_{BE}}} = \frac{16*139 uV/°K}{1.2V}$$

This gives a temperature gradient (sensitivity) of 1.8E-3/° K.

In TCXO applications the absolute accuracy of the temperature sensor is of secondary importance. Essentially this is because in volume manufacture each TCXO is individually calibrated such that the output of the temperature sensor is used to define the value of tuning capacitance required to maintain a constant oscillation frequency as the ambient temperature is varied over a specified range.

In TCXO applications it is therefore not necessary to maintain the absolute linear relationship between ambient temperature and the digital output of the temperature sensor as in [1]. The inventors have realized that improved performance of TCXO applications may be achieved by not maintaining a linear relationship between ambient temperature and the digital output of the temperature sensor. This allows the sensor/ADC arrangement of the present embodiment to produce a temperature characteristic with far greater sensitivity and reduced noise in the digital output, $D_{OUT}$. Furthermore, curvature in the temperature characteristic can be used to increase sensitivity at higher temperatures where thermal noise is greater and crystal oscillation frequency is a stronger function of temperature.

Since absolute temperature accuracy is not a primary concern, there is no longer a requirement for the numerator in eqn. 9 to be proportional to absolute temperature and for the denominator in eqn. 9 to be independent of absolute temperature. Instead eqn. 9 can take the more general form:

$$D_{OUT} = \overline{\text{bit stream}} = \frac{(k_{n1}V_{CE1} + k_{n2}V_{CE2})}{(k_{d1}V_{CE1} + k_{d2}V_{CE2})} \quad \text{(eqn. 13)}$$

Where $k_{n1}$, $k_{n2}$, and, $k_{d1}$, $k_{d2}$ are coefficients which can take positive, negative or zero value, depending on the sampling capacitors in the first stage of the DSM. In eqn. 13, $D_{OUT}$ is a temperature sensor output signal and may be a dimensionless signal/code. $D_{OUT}$ is generated in dependence on the temperature dependent signals, also referred to as temperature signals, output from the transistor circuits according to the first or second embodiments. The temperature dependent voltages are therefore collector-emitter voltages instead of base-emitter voltages.

In particular, in the present embodiment, the denominator, which effectively serves as the ADC reference, $V_{REF}$, is made a function of absolute temperature. This may dramatically increase the temperature sensitivity of the sensor/ADC architecture.

For the case where $k_{d1}$ and $k_{d2}$ both have the same sign, the denominator becomes a weighted summation of $V_{CE1}$ and $V_{CE2}$, and substantially has the temperature characteristic of the base emitter voltage, $V_{BE}$ (the drop in the cancellation resistor $R_{gm}$ in the first embodiment is small and it is appropriate for it to be ignored).

$V_{BE}$ exhibits a very strong temperature dependency of approximately −2 mV/° K. By using this as the denominator in eqn. 9 the ADC reference becomes a strong function of temperature, decreasing by −2 mV/° K causing the ADC output, $D_{OUT}$, to increase accordingly.

Similarly, for the case where $k_{n1}$ and $k_{n2}$ are of opposite sign, the numerator becomes a weighted difference of $V_{CE1}$ and $V_{CE2}$ and exhibits a positive temperature characteristic, although not necessarily the PTAT relationship identified in eqn. 10, except in the case where $k_{n1}$ and $k_{n2}$ have the same magnitude.

With no requirement to ensure the absolute accuracy of the PTAT term in eqn. 10, $Q_1$ and $Q_2$ can operate at substantially different current densities. In embodiments, the current density ratio between $Q_1$ and $Q_2$ may be about 100:1, or a higher, or lower, ratio than 100:1. Increasing the current density ratio further reduces the size of any additional gain term, a, and hence noise from the sensor is reduced in the ADC output $D_{OUT}$. The advantages of increasing the current density ratio is limited, owing to the logarithmic relationship between the $\Delta V_{BE}$ and the current densities $J_1$ and $J_2$, identified in eqn. 10.

An example implementation of the present embodiment for the case where the current density $J_1$ and $J_2$ is 100:1 is given in eqn. 14.

$$D_{OUT} = \overline{\text{bit stream}} = \frac{(2.75\,V_{CE1} - 3.5\,V_{CE2})}{(0\,V_{CE1} + 0.75\,V_{CE2})} \quad \text{(eqn. 14)}$$

Figure 10:
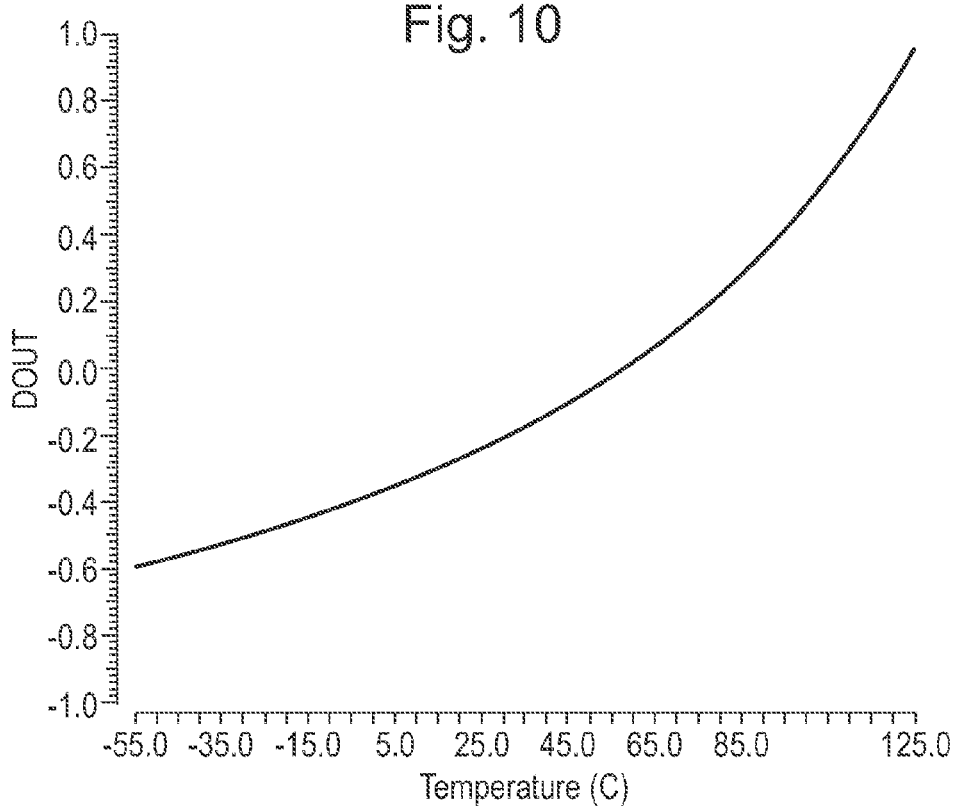
FIG. 10 shows the output signal vs. temperature characteristic of a temperature measurement circuit according to a third embodiment.

FIG. 10 shows the $D_{OUT}$ vs. temperature characteristic of the example implementation of the present embodiment in eqn. 14.

In FIG. 10, the results indicating the $D_{OUT}$ vs. temperature characteristic of the third embodiment has been generated with the following:

$k_{n1}$=2.75
$k_{n2}$=−3.5
$k_{d1}$=0
$k_{d2}$=0.75
J1/J2=100

The graph in FIG. 10 has been generated with the temperature sensor comprising transistor circuits of the first embodiment.

It should be noted that the coefficients in eqn. 14, which are representative of gain implemented by capacitor scaling in the DSM, result in a gain that is significantly smaller than $\alpha$=16 in [1]. This substantially reduces the noise in the ADC output, $D_{OUT}$.

FIG. 10 uses a bipolar representation of the ADC output {+1,−1}, instead of {0,1} in [1]. For comparison of the performance of the third embodiment with [1], FIG. 11 shows the two characteristics scaled to represent a {0,1} ADC output bit stream.

Figure 11:
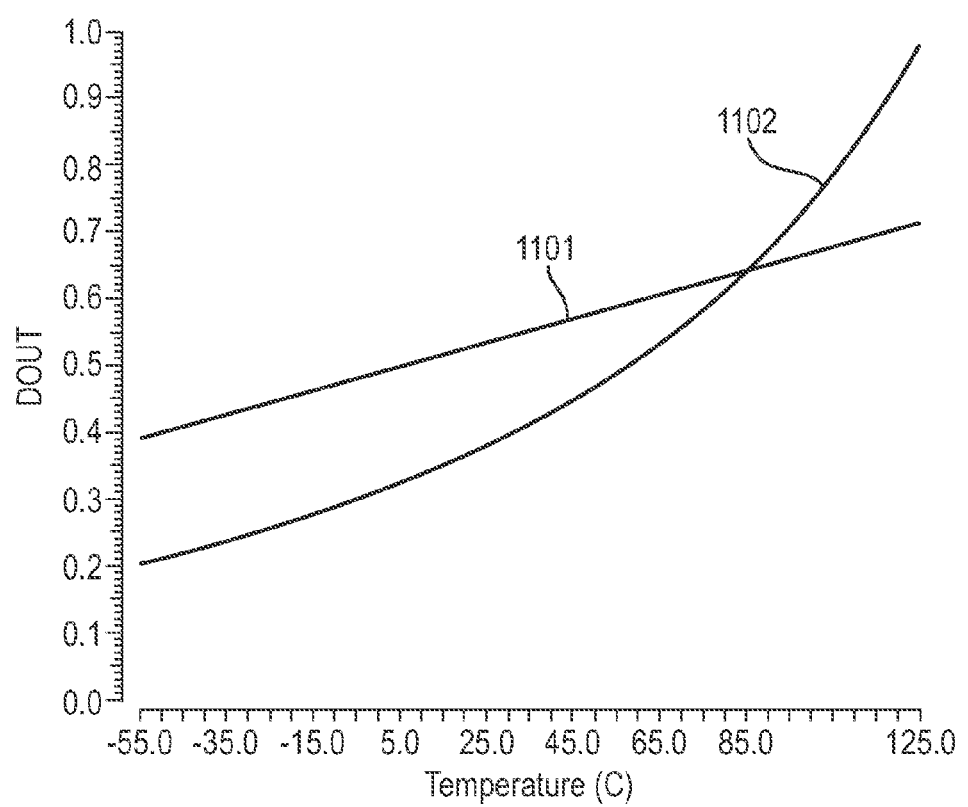
FIG. 11 shows the output signal vs. temperature characteristic of both a known temperature measurement circuit and a temperature measurement circuit according to a third embodiment.

The line in FIG. 11, labelled 1101, corresponds to the techniques disclosed in [1]. The line in FIG. 4, labelled 1102, corresponds to the techniques of the third embodiment.

In FIG. 11:
For line 1101 of [1], at all temperatures, $dD_{OUT}/dT$=1.80E-3 V/° K
For line 1102 of the third embodiment, at −55° C., $dD_{OUT}/dT$=1.80E-3 V/° K
For line 1102 of the third embodiment, at 25° C., $dD_{OUT}/dT$=3.00E-3 V/° K
For line 1102 of the third embodiment, at 125° C., $dD_{OUT}/dT$=11.2E-3 V/° K
For line 1101 of [1], the bitstream noise density is 41 nFS/sqrt(Hz)—where FS is the ADC full scale
For line 1102 of the third embodiment, the bitstream noise density is 27 nFS/sqrt(Hz)—where FS is the ADC full scale The graph in FIG. 11 has been generated with the temperature sensor comprising transistor circuits of the first embodiment and the DSM ADC of the third embodiment.

FIG. 11, and the above, clearly demonstrate the advantages of the increased sensitivity and reduced noise in the bitstream.

Accordingly, the third embodiment provides a temperature sensor signal that is dependent on a plurality of temperature dependent signals input to an ADC. The techniques of the third embodiment may be used on their own to improve the performance of ADCs. Preferably, the techniques of the third embodiment are used in addition to those of the first and/or second embodiments.

Figure 12A:
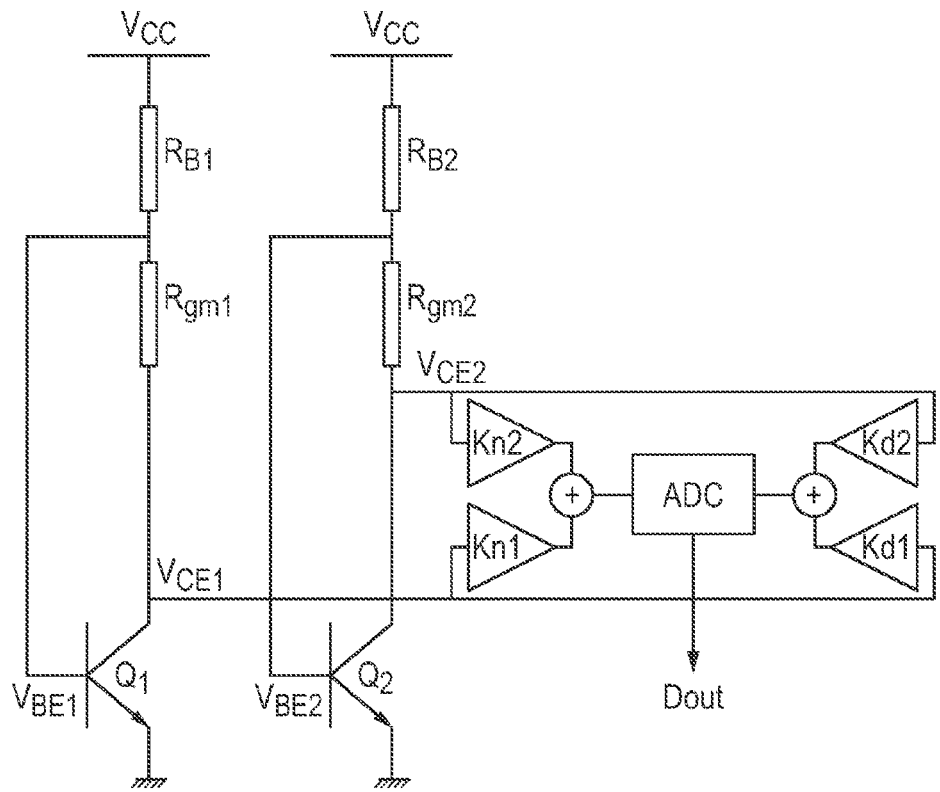
FIG. 12A shows an implementation of a DSM ADC according to the third embodiment with temperature sensors according to the first embodiment.

FIG. 12A shows an implementation of a DSM ADC according to the third embodiment with temperature sensors according to the first embodiment.

Figure 12B:
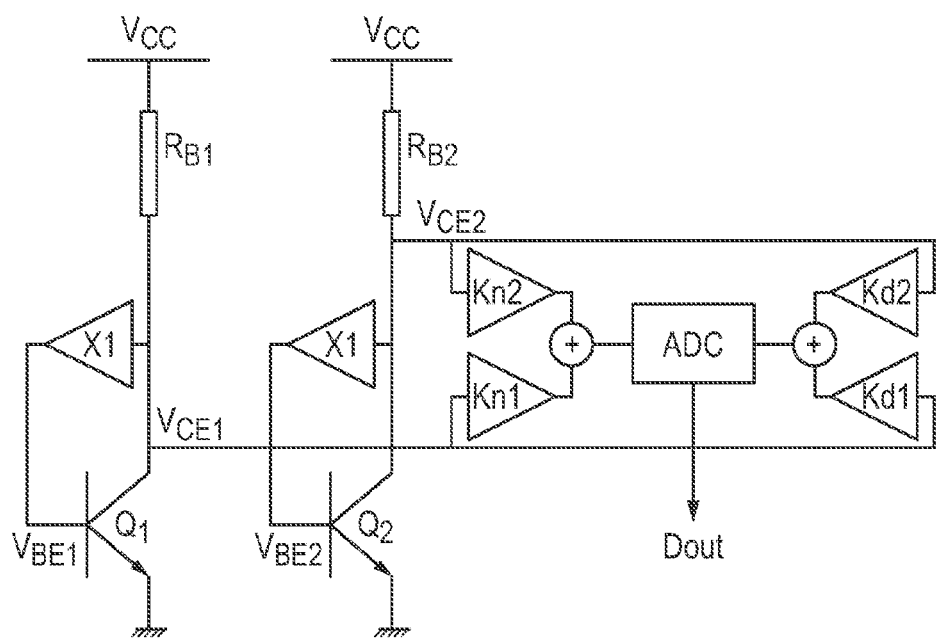
FIG. 12B shows an implementation of a DSM ADC according to the third embodiment with temperature sensors according to the second embodiment.

FIG. 12B shows an implementation of a DSM ADC according to the third embodiment with temperature sensors according to the second embodiment.

In both FIGS. 12A and 12B, the values of the components may be:

$R_{B1}$=12 kOhm
$R_{B2}$=12 kOhm
$R_{gm1}$=612 Ohm
$R_{gm2}$=612 Ohm
$g_{m1}$=1.64 mA/V
$g_{m2}$=1.64 mA/V
$k_{n1}$=2.75
$k_{n2}$=3.50
$k_{d1}$=0.00
$k_{d2}$=0.75
Area of Q2=100*Area of Q1

In the following, an explanation of how $k_{n1}$, $k_{n2}$, $k_{d1}$ and $k_{d2}$ may be defined by a DSM ADC implementation is provided.

In the operation of a DSM ADC, on every clock cycle each integrator stage either increases or decreases its output based on the result of the previous quantization.

In the general case for an integrator and single bit quantizer:

b0 integrate up by $V_1$
b1 integrate down by $V_2$

With b0 and b1 representing the single bit quantizer output possibilities.

For a fixed input to the DSM and for the output of the integrator to remain bounded this necessarily results in the condition given in:

$$n*V_1 = m*V_2 \qquad \text{eqn. aux1}$$

Where n is the number of b0 quantizer outputs and m is the number of b1 quantizer outputs.

Mapping b0 to −1 and b1 to +1 in the DSM output bit stream, the average value of the bit stream is given by:

$$\frac{n*-1 + m*+1}{(n+m)}$$

Substituting for:

$$n = \frac{mV_2}{V_1} \qquad \text{eqn. aux 2}$$

$$\frac{\left(m - m\frac{V_2}{V_1}\right)}{\left(m + m\frac{V_2}{V_1}\right)} = \frac{(V_1 - V_2)}{(V_1 + V_2)}$$

Comparison with the generalized sensor transfer function numerator and denominator gives:

$$V_1 - V_2 = K_{N1}V_{CE1} - K_{N2}V_{CE2}$$

$$V_1 + V_2 = K_{D1}V_{CE1} + K_{D2}V_{CE2}$$

$$2V_1 = (K_{N1}+K_{D1})V_{CE1} - (K_{N2}-K_{D2})V_{CE2}$$

$$2V_2 = (K_{N2}+K_{D2})V_{CE2} - (K_{N1}-K_{D1})V_{CE1} \qquad \text{eqn. aux3a/3b}$$

The following is a worked example to implement the overall temperature sensor/ADC transfer function given in eqn. 14, namely:

$$D_{OUT} = \overline{\text{bit stream}} = \frac{(2.75\,V_{CE1} - 3.5\,V_{CE2})}{(0\,V_{CE1} + 0.75\,V_{CE2})}$$

$K_{N1} = 2.75,\ K_{N2} = 3.50$ $K_{D1} = 0,\ K_{D2} = 0.75$ $2V_1 = (2.75 + 0)V_{CE1} - (3.5 - 0.75)V_{CE2}$ $2V_2 = (3.5 + 0.75)V_{CE2} - (2.75 - 0)V_{CE1}$ $V_1 = 1.375\,V_{CE1} - 1.375\,V_{CE2}$ $V_2 = 2.125\,V_{CE2} - 1.375\,V_{CE1}$

The corresponding switched capacitor actions for the DSM integrator become:

$=1.375(V_{CE1}-V_{CE2})=0.75V_{CE2}-1.375(V_{CE1}-V_{CE2})$
b=0 Add $V_1$ $=1.375(V_{CE1}-V_{CE2})=0.75V_{CE2}-1.375(V_{CE1}-V_{CE2})$
b=1 Sub $V_2$

Alternatively, the action for b=1 can be expressed as b=1 Add−$V_2$=1.375($V_{CE1}-V_{CE2}$)−0.75$V_{CE2}$ Consequently, in this particular worked example, the transfer function has been selected such that the DSM always integrates up by 1.375($V_{CE1}-V_{CE2}$), and also integrates down by 0.75$V_{CE2}$ only when the quantizer output is 1.

Figure 13A:
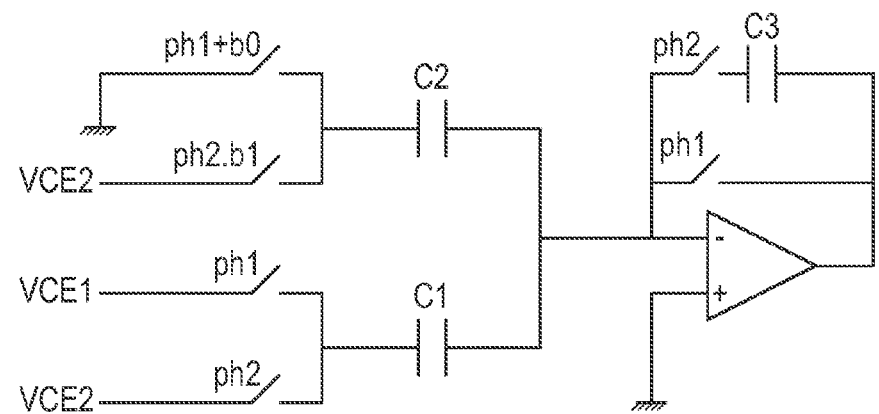
FIG. 13A shows an implementation of a DSM ADC according to the third embodiment with temperature sensors according to the first embodiment.

This leads to the implementation of the DSM integrator, in single ended format, shown in FIG. 13A. A fully differential version of the DSM integrator is shown in FIG. 13B.

Figure 13B:
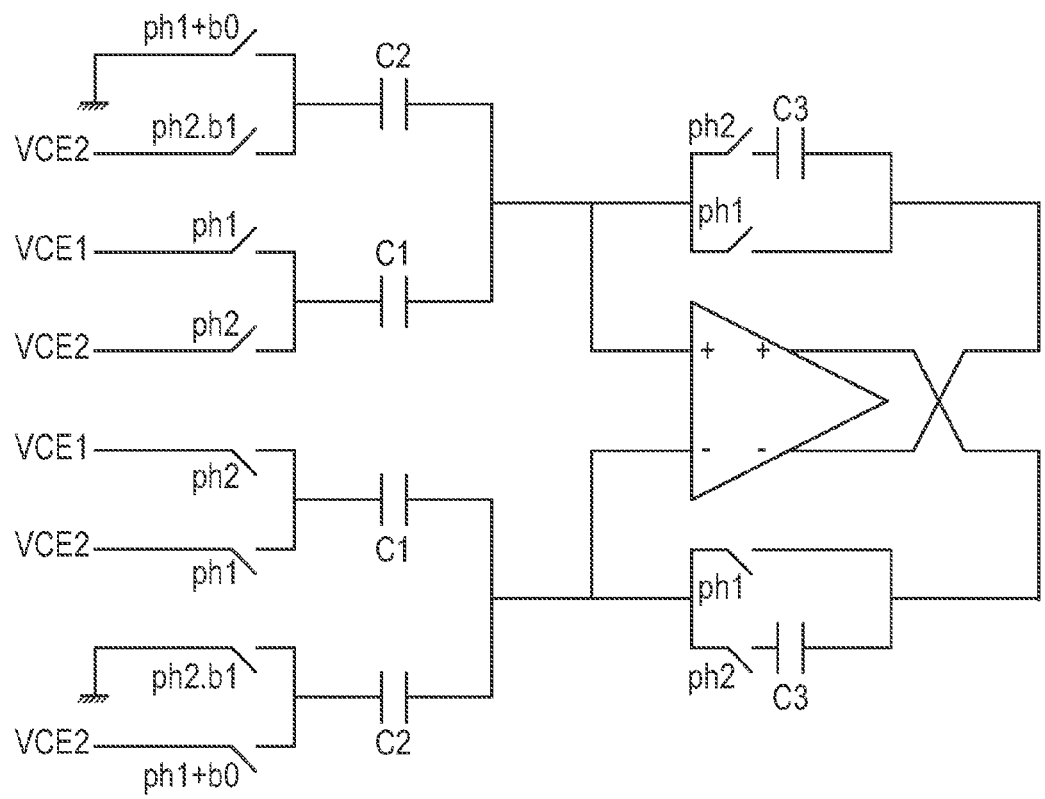
FIG. 13B shows an implementation of a DSM ADC according to the third embodiment with temperature sensors according to the second embodiment.

In present worked example, the capacitors C1 and C2 in FIGS. 13A and 13B may have any values that satisfy the condition that the ratio of the capacitors C1 and C2 is 1.375/0.75. The absolute values of C1 and C2 may be determined in dependence on the sample rate and kT/C noise, whilst the integrator gain is dependent on the absolute value of C3.

In a preferred implementation, the capacitors C1, C2 and C3 are provided as a plurality of identical individual capacitive units. For example, each capacitive unit may be a 128 fF capacitor. C1 may comprises 33 such capacitive units, C2 may comprise 18 such capacitive units and C3 may comprise 64 such capacitive units.

Accordingly:

$C1 = 33 \times 128\,fF = 4.224\,\text{pF}$ $C2 = 18 \times 128\,fF = 2.304\,\text{pF}$ $C3 = 64 \times 128\,fF = 8.192\,\text{pF}$ $$\frac{C1}{C2} = \frac{33}{18} = \frac{1.375}{0.75}$$

In FIGS. 13A and 13B, the ADC uses a delta-sigma modulator approach, with the integrators implemented using a switched-capacitor technique. In a DSM of this type activity takes place under control of a digital clock, with activity taking place on both the high and low phases of the clock. These are referred to as phase1 and phase2, or more commonly ph1 and ph2 (as shown in FIGS. 13A and 13B).

These alternately take the value 0 or 1 such that when ph1 is 1 (high) ph2 is 0 (low) and vice-versa.

Referring to the single-ended implementation depicted in FIG. 13A, the open and closed state of each switch is controlled by the associated control signal, either ph1, ph2 alone or in combination with the output of a single bit binary digital quantizer, b.

During ph1 the VCE1 voltage is sampled onto C2 and a zero (ground) voltage sampled onto C2. The integrating capacitor C3 is disconnected, and the operational amplifier connected in unity gain negative feedback.

During ph2, C1 is connected to VCE2 and the integrating capacitor is connected into the circuit and the unity gain negative feedback to the operational amplifier removed.

A consequence of this action is that a charge Q1=C1* (VCE1-VCE2) is ADDED to the integrating capacitor C3.

Operation of C2 during ph2 is dependent on the binary quantizer value, b.

If the output of the quantizer is low, the b0 case, then C2 remains connected to the zero voltage. This is denoted by the control signal ph1+b0. In conventional Boolean logic notation this corresponds to ph1 OR b0.

If the output of the quantizer is high, the b1 case, then C2 is connected to VCE2. This is denoted by the signal ph2.b1 which in Boolean logic notation corresponds to ph2 AND b1.

As a consequence of the above a charge Q2=C2*VCE2 is SUBTRACTED from the integrating capacitor C3 during ph2 only for the b1 case. For the b0 case, C2 remains connected to zero during ph2 and no charge is transferred to C3.

Overall, throughout a full ph1 and ph2 cycle the charge on the integrator capacitor C3 ALWAYS increases by an amount Q1 and ONLY decreases by the amount Q2 when the output of the quantizer is high, the b1 case. This gives rise to the above-described DSM operation.

DOUT, that may be generally referred to as the bitstream output, are the successive binary outputs of the quantizer. This is not explicitly shown in FIGS. 13A and 13B. However, it may be expressed via b0 and b1. DOUT=0 for the b0 case, DOUT=1 for the b1 case.

In a particularly preferred embodiment, a TCXO is provided in which the temperature sensor comprises a DSM ADC according to the third embodiment and two transistor circuits according to the first or second embodiments.

The TCXO may comprise a crystal oscillator arrangement. The crystal oscillator arrangement may comprise a crystal oscillator and a circuit for supporting the crystal oscillator.

The transistor of each transistor circuit may be thermally coupled to the crystal oscillator arrangement and is preferably thermally coupled to the crystal oscillator.

The output signal, $D_{OUT}$, from the DSM ADC, as shown in FIGS. 12A and 12B, and FIGS. 13A and 13B, is dependent on the temperature of the crystal oscillator arrangement and/or crystal oscillator. Embodiments include applying techniques to compensate for the temperature dependent performance variations of the crystal oscillator arrangement and/or crystal oscillator in dependence on the output signal $D_{OUT}$ from the DSM ADC. For example, a capacitance in the circuit for supporting the crystal oscillator may be varied in dependence on output signal, $D_{OUT}$, to reduce, or substantially prevent, temperature dependent variation of an output signal of the crystal oscillator arrangement.

The TCXO may be an integrated circuit.

Embodiments include a number of modification and variations to the techniques described above.

Implementations of the third embodiment also include the ADC being arranged to receive temperature signals from more than two transistor circuits, and to generate a temperature sensor signal in dependence on more than two received temperature signals.

In the above described embodiments, low noise NPN transistor circuits are used to obtain temperature measurements. Embodiments also include using low noise PNP transistor circuits and/or JFET transistor circuits.

The PNP transistors in [1] are effectively diodes because two of the PNP transistor ports are directly connected together. In [1], the PNP transistors are not biased in low noise configuration. Embodiments include alternatively using bias arrangements of the transistors in which two ports are not directly together. The selection of resistor values, use of a buffer, and/or selection of BJT areas as described above for the first and second embodiments, may similarly be used to provide low noise performance with PNP and JFET transistors.

Embodiments preferably use a DSM ADC. However, this is not essential and embodiments may use other types of ADC than a DSM.

The transistor circuits of the first and second embodiments may be used with other techniques than those of the third embodiment. In particular, the transistor circuits of the first and second embodiments may be used to provide the input signals to the ADC disclosed in [1].

In the second embodiment, each buffer 501, 502 is preferably a unity gain buffer. However, embodiments also include each buffer 501, 502 alternatively having a gain that is more than, or less than, one.

The above-description of embodiments are intended to be illustrative, not limiting. Thus it will be apparent to one skilled in the art that modifications may be made to the invention as described without departing from the spirit and scope of the claims set out below.

We claim:

1. A temperature compensated crystal oscillator, TCXO, comprising:
    a crystal oscillator arrangement configured to generate an output signal of the temperature compensated crystal oscillator; and
    a temperature sensor arranged to generate a temperature sensor signal, wherein the output signal of the crystal oscillator arrangement is controlled in dependence on the temperature sensor signal;
    wherein:
    the temperature sensor comprises a plurality of transistor circuits;
    each transistor circuit comprises a transistor and a bias circuit;
    each transistor circuit is arranged to output a temperature signal that is dependent on the temperature of the transistor comprised by the transistor circuit;
    wherein the plurality of transistor circuits are arranged so that the temperature sensor signal is dependent on each of the plurality of output temperature signals;
    wherein, for each transistor circuit, the transistor bias circuit comprises:
    a bias resistor arranged between a power supply of the transistor bias circuit and a base terminal of the transistor;
    a collector-base resistor arranged between a collector terminal and the base terminal of the transistor; and
    wherein an emitter terminal of the transistor is connected to ground; and wherein, for each transistor circuit, a value of the collector-base resistor is substantially equal to an inverse of a transconductance of the transistor.

2. The TCXO according to claim 1, wherein, for each transistor circuit, the transistor bias circuit is configured such that noise generated within the transistor is at least partially reduced by the bias circuit.

3. The TCXO according to claim 1, wherein, for each transistor circuit:
the transistor is an NPN transistor; and
the transistor bias circuit is configured so that the output temperature signal is dependent on the collector-emitter voltage of the transistor.

4. The TCXO according to claim 1, wherein, for each transistor circuit, the bias resistor and collector-base resistor are the same type of resistor.

5. The TCXO according to claim 1, wherein, for each transistor circuit, a base spreading resistance of the transistor is in the range 1 Ohm to 200 Ohm.

6. The TCXO according to claim 1, wherein the temperature sensor is thermally coupled to the crystal oscillator circuit arrangement.

7. The TCXO according to claim 1, wherein:
the crystal oscillator circuit arrangement comprises a crystal oscillator; and
the temperature sensor is thermally coupled to the crystal oscillator.

8. The TCXO according to claim 1, wherein the temperature sensor comprises:
an analogue-to-digital convertor, ADC;
wherein the ADC is arranged to generate the temperature sensor signal in dependence on each of the output temperature signals from the plurality of transistor circuits; and
wherein the ADC is a delta-sigma modulator, DSM;
wherein the number of transistor circuits is two;
wherein the DSM is configured so that the output signal, $D_{OUT}$, of the DSM is:

$$D_{OUT} = \frac{(k_{n1}V_{CE1} + k_{n2}V_{CE2})}{(k_{d1}V_{CE1} + k_{d2}V_{CE2})}$$

where:
$V_{CE1}$ is the collector-emitter voltage of the transistor in a first one of the transistor circuits;
$V_{CE2}$ is the collector-emitter voltage of the transistor in a second one of the transistor circuits;
the coefficients $k_{n1}$, $k_{n2}$, $k_{a1}$, $k_{a2}$ are dependent on sampling capacitances of the DSM; and
the sampling capacitances of the DSM are selected so that $k_{n1}$, $k_{n2}$, $k_{a1}$, $k_{a2}$ can take positive, negative or zero values;
wherein the sampling capacitances of the DSM are selected so that:
$k_{n1}=2.75$;
$k_{n2}=-3.5$;
$k_{d1}=0$; and
$k_{d2}=0.75$.

9. The TCXO according to claim 1, wherein:
the temperature sensor comprises a first transistor circuit and a second transistor circuit; and
the ratio of the current density of the transistor in the first transistor circuit and the second transistor circuit is greater than 50:1.

10. A temperature compensated crystal oscillator, TCXO, comprising:
a crystal oscillator arrangement configured to generate an output signal of the temperature compensated crystal oscillator; and
a temperature sensor arranged to generate a temperature sensor signal,
wherein the output signal of the crystal oscillator arrangement is controlled in dependence on the temperature sensor signal;
wherein:
the temperature sensor comprises a plurality of transistor circuits;
each transistor circuit comprises a transistor and a bias circuit;
each transistor circuit is arranged to output a temperature signal that is dependent on the temperature of the transistor comprised by the transistor circuit;
wherein the plurality of transistor circuits are arranged so that the temperature sensor signal is dependent on each of the plurality of output temperature signals;
wherein, for each transistor circuit, the transistor bias circuit comprises:
a buffer arranged between a collector terminal and a base terminal of the transistor;
a bias resistor arranged between a power supply of the transistor bias circuit and the collector terminal of the transistor; and
the emitter terminal of the transistor is connected to ground;
wherein the buffer has a gain of 1;
wherein, for each transistor circuit, the buffer is an emitter follower; and
wherein, for each transistor circuit, the buffer comprises a MOS based amplifier.

11. An integrated circuit comprising a temperature compensated crystal oscillator, TCXO, that comprises:
a crystal oscillator arrangement configured to generate an output signal of the temperature compensated crystal oscillator; and
a temperature sensor arranged to generate a temperature sensor signal, wherein the output signal of the crystal oscillator arrangement is controlled in dependence on the temperature sensor signal;
wherein:
the temperature sensor comprises a plurality of transistor circuits;
each transistor circuit comprises a transistor and a bias circuit;
each transistor circuit is arranged to output a temperature signal that is dependent on the temperature of the transistor comprised by the transistor circuit;
wherein the plurality of transistor circuits are arranged so that the temperature sensor signal is dependent on each of the plurality of output temperature signals;
wherein, for each transistor circuit, the transistor bias circuit comprises:
a bias resistor arranged between a power supply of the transistor bias circuit and a base terminal of the transistor;
a collector-base resistor arranged between a collector terminal and the base terminal of the transistor; and
wherein an emitter terminal of the transistor is connected to ground; and wherein, for each transistor circuit, a value of the collector-base resistor is substantially equal to an inverse of a transconductance of the transistor.

* * * * *